(12) United States Patent
Bezama et al.

(10) Patent No.: US 6,285,080 B1
(45) Date of Patent: Sep. 4, 2001

(54) PLANAR METALLIZED SUBSTRATE WITH EMBEDDED CAMBER CONTROL MATERIAL AND METHOD THEREOF

(75) Inventors: Raschid J. Bezama, Mahopac; Kenneth A. Bird, New Paltz; Alan Piciacchio, Fishkill; Robert A. Rita, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/198,820

(22) Filed: Nov. 23, 1998

(51) Int. Cl.$^7$ .................................................. H01L 23/48
(52) U.S. Cl. .................. 257/738; 257/690; 257/700; 257/737; 257/738; 428/209; 428/212; 428/469; 428/701; 428/901
(58) Field of Search ..................... 428/551, 469, 428/209, 212, 701, 901; 257/690, 700, 737, 738

(56) References Cited

U.S. PATENT DOCUMENTS

| | | | |
|---|---|---|---|
| 3,879,509 | 4/1975 | Elderbaum | 264/56 |
| 4,340,436 | 7/1982 | Dubetsky et al. | 156/89 |
| 4,972,253 | * 11/1990 | Palino et al. | 357/74 |
| 5,130,067 | 7/1992 | Flaitz et al. | 264/60 |
| 5,224,265 | * 7/1993 | Dux et al. | 29/852 |
| 5,369,056 | 11/1994 | Burns et al. | 437/209 |
| 5,369,058 | 11/1994 | Burns et al. | 437/209 |
| 5,439,636 | * 8/1995 | Bezama et al. | 419/3 |
| 5,541,005 | * 7/1996 | Bezema et al. | 428/551 |
| 5,543,661 | * 8/1996 | Sumida | 257/707 |
| 5,790,386 | * 8/1998 | Magee | 361/777 |
| 5,949,304 | * 9/1999 | Heine et al. | 333/175 |
| 5,977,850 | * 11/1999 | Chaturvedi | 333/238 |
| 6,111,367 | * 9/2000 | Bezama et al. | 252/514 |

OTHER PUBLICATIONS

IBM, Technical Disclosure Bulletin, vol. 23, No. 5, Oct. 1980 entitled "Method For Reduction Of Shrinkage Distortion In Ceramic Substrates" J. M. Brownlow, D.J. Dubetsky, A.M. Hussey and W.A. Meister.

* cited by examiner

Primary Examiner—Deborah Jones
Assistant Examiner—Stephen Stein
(74) Attorney, Agent, or Firm—Margaret A. Pepper

(57) ABSTRACT

The present invention relates generally to new planar substrates that are metallized and embedded with material to minimize the camber and method thereof. The invention also relates to the fabrication of multilayer ceramic (MLC) substrates for packaging electronic devices. More particularly, this invention relates to the fabrication of thin and small ceramic substrates which do not need post-sintering processing to control the flatness of the sintered product.

22 Claims, 2 Drawing Sheets

PLANAR METALLIZED SUBSTRATE WITH EMBEDDED CAMBER CONTROL MATERIAL AND METHOD THEREOF

FIELD OF THE INVENTION

The present invention relates generally to new planar substrates that are metallized and embedded with material to minimize the camber and method thereof The invention also relates to the fabrication of multilayer ceramic (MLC) substrates for packaging electronic devices. More particularly, this invention relates to the fabrication of thin and small ceramic packages which do not need post-sintering processing to control the flatness of the sintered product.

BACKGROUND OF THE INVENTION

Ceramic packages are needed by the electronic industry to provide a required level of electrical interconnection between an electronic device, such as, a chip, and a board, such as, a plastic board.

The ceramic substrates have the ability to provide a high density interconnection surface on the top layer which connects to the integrated circuit chip and a lower density interconnection surface on the bottom layer which connects to the board. This interconnection density is particularly high when flip-chip solder balls, such as, C4 (Control Collapse Chip Connection) are used on the top surface and ball grid array (BGA) technology is used on the bottom surface of the ceramic substrate or package.

In addition to the two external layers described earlier, the ceramic package typically has several internal layers which provide distinct electrical functions. The first function is to provide power to the electronic device, such as, a chip, and this function is done by the voltage plane layers. The second function is to provide connectivity between the signal output from the integrated circuit chip to the signal lines on the board, and this function is done by the redistribution layers. In some cases both functions may be provided in the same layer. This may be done for a variety of reasons, such as, when it is necessary to minimize the package layer count.

The number of layers required by the ceramic package to provide the specified electronic connectivity function is dependent both on the complexity of the integrated circuit chip and on the level of integration that the thick film processing line can achieve when building the ceramic package.

Continuous advancement of the thick film processing capabilities has been reducing the number of layers needed to provide the required electrical connectivity in the ceramic package. Also, the introduction of BGA to the BSM (bottom surface metallurgy) side which connects to the board allows significant reduction in the size of the ceramic package required when compared to similar packages manufactured with, for example, pins.

Thus, the market trend is moving toward ceramic packages which are small and thin when the connectivity function is required to package a single integrated circuit chip. The reduction in dimension is also followed by a reduction in the cost of processing such ceramic packages, as more units can be fabricated on the same space previously taken during the fabrication of larger ceramic packages.

Of particular concern in processing the smaller ceramic packages is the control of the package camber during sintering. If the ceramic package is not sufficiently flat after sintering, it needs to be discarded or reworked, and in both cases the product cost is increased significantly, because of the relatively high rework cost; the increased need to characterize the product; and/or the replacement cost associated with discarded product.

The flatness requirements of a ceramic package are driven by the processes used after the sintering process. Typically, the top surface of a ceramic package requires a flatness of under 30 microns in the area where the electronic device will be connected to the ceramic package. This flatness requirement is known as the via bulge specification.

The bottom surface typically requires a flatness of under 150 microns through the area where the ball grid array (BGA) is located. This flatness requirement is known as the substrate camber specification.

In large and thick ceramic packages, the ceramic via bulge is a weak function of the substrate bottom surface and a strong function of the substrate internal wiring design. A large camber at the bottom of the package or high via bulge at the top will result in electrical shorts or opens in the final assembled module. However, as the package becomes small and thin and the integrated circuit chip becomes large, a larger fraction of the substrate camber becomes the package via bulge because in thin products the package top surface mimics the bottom surface. Ultimately, when the package and the electronic device are the same size, such as in chip-scale packaging, the substrate camber requirement will be the same as the via bulge requirement, for example about 30 microns. This trend increases the need to improve the camber control on small and thin ceramic packages.

Several methods have been proposed to reduce camber in ceramic packages during sintering.

In U.S. Pat. No. 5,130,067 (Flaitz et al.) and U.S. Pat. No. 4,340,436 (Dubetsky et al.), the disclosures of which are incorporated herein by reference, the camber of a substrate is kept under control by the use of an externally applied force during all or part of the sintering process. The Flaitz process uses weights with openings which allow the sintering furnace gas to access the ceramic surface through the sinter cycle. The Dubetsky method processes the ceramic product in two steps: the first step is done without weights to allow gas access to the ceramic when needed, and the second step uses weights to carry the ceramic densification step. In both methods, the use of weights reduces the furnace capacity and increases the furnace thermal load; therefore, the sintering cost is increased when compared to the cost of sintering the same substrates without weights.

An alternative method to control camber on thin packages has been shown in U.S. Pat. Nos. 5,369,056 and 5,369,058 (Burns et al.). These patents describe a method to modify or prevent camber of thin packages by using layers with different coefficient of thermal expansion (CTE) on the package surface than the CTE of the package body. This approach is also practiced in ceramic packages when it is desirable to develop a compressive layer on the package surface to improve the ceramic surface mechanical properties. Unfortunately, the use of a CTE gradient is only practical when mechanical properties of the package are suitable for such effect, like plastic or metal assemblies with low elastic modules. Ceramic packages, which have high elastic modules, will not bend sufficiently when using the Burns methods to compensate for camber problems.

Ceramic package camber is produced during the sintering process by two independent mechanisms: ceramic shrinkage rate gradients in the package, and the difference in shrinkage rate between the ceramic and metal phases found in a typical electronic ceramic package. Both mechanisms must be controlled simultaneously to produce a substrate with low camber. The ceramic shrinkage rate gradient can be reduced by proper selection of the ceramic layer materials.

The use of specially shaped shims has also been described in the literature, such as, in IBM Technical Disclosure Bulletin, "*Method for Reduction of Shrinkage Distortion in Ceramic Substrates*", Vol. 23, No. 5, Pages 1885–1886 (October 1980) (Brownlow) or U.S. Pat. No. 3,879,509 (Elderbaum) where efforts have been made to reduce ceramic shrinkage rate gradients during the lamination process.

U.S. Pat. No. 6,117,367 (Bezama et al.), the disclosure of which is incorporated herein by reference., discloses a set of pastes that reduce substrate defects, such as, via bulge and camber. The pastes are comprised of a metal having high conductivity, frit which includes glass, an organic binder, and a solvent, optionally with a surfactant.

Attempts to reduce the difference in shrinkage rate differential between the ceramic and the metal have not been successfull because of the intrinsic different nature of the materials being co-sintered.

However, it is possible to minimize the metal-induced ceramic package camber by adequately balancing the distribution of metal phase inside the package during the package design phase. But, the metal distribution balancing effort becomes more difficult as the number of layers used to build the ceramic package decreases.

PURPOSES AND SUMMARY OF THE INVENTION

The invention is directed to a new planar substrate that is metallized and is thin and where the via bulge and camber have been optimized.

Therefore, one purpose of this invention is to fabricate multilayer ceramic substrates for packaging electronic devices.

Another purpose of this invention is to fabricate thin and small ceramic packages which do not need post-sintering processing to control the flatness of the sintered product.

Yet another purpose of this invention is to manufacture thin and small ceramic substrates with low flatness.

Still yet another purpose of this invention to provide a process which minimizes the cost of sintering such thin and small ceramic packages and requires no flattening.

Therefore, in one aspect this invention comprises a multilayer ceramic substrate, comprising at least four ceramic layers with at least two internal voltage/ground planes, wherein said at least two internal voltage/ground planes are screened with the same electrically conductive metal paste, but have a difference in metal volume coverage which is greater than at least about 10 percent between at least two of said voltage/ground planes.

In another aspect this invention comprises a multilayer ceramic substrate, comprising at least four ceramic layers with at least two internal voltage/ground planes, wherein said at least two internal voltage/ground planes are screened with at least one different electrically conductive metal paste, and also have a difference in metal volume coverage which is greater than at least about 10 percent between at least two of said voltage/ground planes.

In yet another aspect this invention comprises a multilayer ceramic substrate, comprising at least four ceramic layers with at least two internal voltage/ground planes, wherein at least a portion of at least one internal voltage/ground plane is screened with two different electrically conductive metal pastes.

In still another aspect this invention comprises a method for evaluating a new metal paste impact on camber in a MLC product consisting of:

Selecting a test vehicle which has at least one voltage plane and one bottom I/O layer, Building said test vehicle by screening said voltage plane with a first electrically conductive metal paste which needs to be evaluated, Sintering said test vehicle and measuring its camber, Building and sintering another test vehicle using a reference electrically conductive metal paste in the voltage plane, and Generating a paste factor or relative camber number (RCN) by dividing the camber number generated from said paste test vehicle and the camber measured from said test vehicle built using said reference metal paste.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
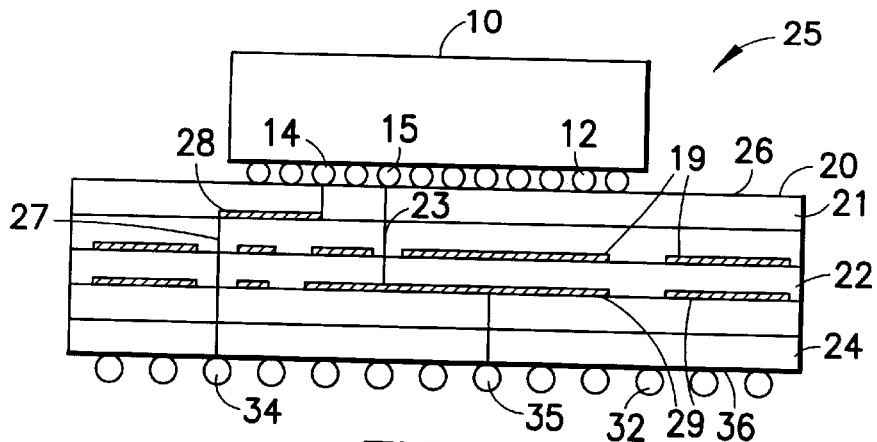
FIG. 1, is a schematic cross-sectional view of a typical five layer electronic ceramic substrate with an attached integrated circuit chip on the top surface.

FIG. 1 is a schematic cross-sectional view of a typical five layer electronic ceramic package 25 with an attached electronic device 10, such as an integrated circuit chip or a capacitor on the top surface 26 of a substrate 20, such as a ceramic substrate.

The ceramic substrate 20 is shown with five ceramic layers. However, the substrate 20 could have more or less number of layers depending upon the application. The ceramic substrate 20 is attached to an electronic device or chip 10 by means of an array of solder mass 12, 14 and 15, such as solder balls, solder columns, or C4s.

A typical top surface metallurgy in a ceramic package 25 covers about 2 percent of the ceramic area to provide the required connectivity between the ceramic substrate 20, and the electronic device 10.

The bottom surface 36 of the ceramic substrate 20 typically has an array of solder mass 32, 34 and 35, which are used to attach the ceramic substrate 20 to a board, such as a plastic board (not shown).

The bottom surface metallurgy (BSM) in a ball grid array ceramic package typically covers between about 25 percent to about 40 percent of the bottom surface 36 of the ceramic substrate 20. Hence, the surface metallurgy of such ceramic substrate 20 has an inherent imbalance in the metal distribution in the package before the internal metallurgy is taken into account. This imbalance is sufficient to produce a ceramic product with large camber.

The internal metallurgy of a ceramic substrate 20 is also shown in FIG. 1. Vertical signal electrical line 27 connects the electronic device 10 to the board (not shown) via solder balls 14 and 34. This electrical line 27 uses horizontal electrical line 28 of a redistribution layer 21 to provide the required horizontal displacement between the solder connection 14, on the top surface 26, and the solder connection 34, on the bottom surface 36 of the substrate 20. Redistribution layers 21 typically have metallurgical lines 28 which cover between about 8 percent and about 15 percent of the layer available surface. The ceramic substrate 20 in FIG. 1, shows only one such redistribution layer 21, at the interface between the top ceramic layer and the ceramic layer next to the top layer. However, a second redistribution line is possible if the substrate 20 has at most two voltage planes.

Also shown in FIG. 1 is a voltage plane 29 and one ground plane 19. The voltage plane 29, in layer 22, provides power to the electronic device 10 through the vertical metal line 23 and the connecting solder ball 15. The voltage plane 29, in layer 22, also provides a horizontal translation to the vertical voltage line 23 to connect to the solder ball 35, which is electrically connected to a board (not shown). Voltage planes typically have uniformly distributed metallurgy covering between about 30 percent and about 80 percent of the ceramic area available in such layers. Large area coverage typically indicates a layer with solid metal coverage and very limited areas with exposed ceramic. Low area coverage is typically seen in voltage planes designed using a mesh-like metal pattern. A typical ceramic substrate 20 which includes voltage planes will have at minimum two of such planes with nearly identical metal coverage, where one plane is used to supply the voltage and power to the electronic device and the other voltage plane provides the electrical ground connection. Nearly identical voltage planes are standard in electronic substrates 20, because they minimize the design engineering effort to create them. However, for some applications an additional voltage plane may be required if the electronic device 10 needs two different voltage supplies to operate. Typically, these voltage planes are metallized using the same metal paste formulation, mainly to reduce manufacturing costs.

The expected camber of a ceramic substrate, such as the substrate 20 shown in FIG. 1, depends directly on the location and amount of metallurgy used by the voltage layers of the substrate 20. For example, when the substrate 20 is made from alumina ceramic and the internal metallurgy is built with molybdenum metal, camber will be maximum if two voltage layers are located at the two internal layer interfaces near the bottom surface of the substrate 20, and this substrate 20 will warp towards the bottom surface. This effect is explained by the additional shrinkage experienced by the metal phase after the ceramic phase densification is nearly completed. However, if the two voltage planes are placed near the top surface of the substrate 20, the substrate 20 will warp towards the top surface in most cases. In both extreme cases given above the camber generated during sintering exceeds the previously given specifications and rework would be needed to reclaim the product. The described substrate 20 behavior can be reversed if the ceramic material used to built the substrate 20 shrinks more than the metal phase. However, when the two voltage layers are located in the center of the substrate 20, the camber of such design is lower than in the two previously described cases, but still significant camber is observed.

Figure 2:
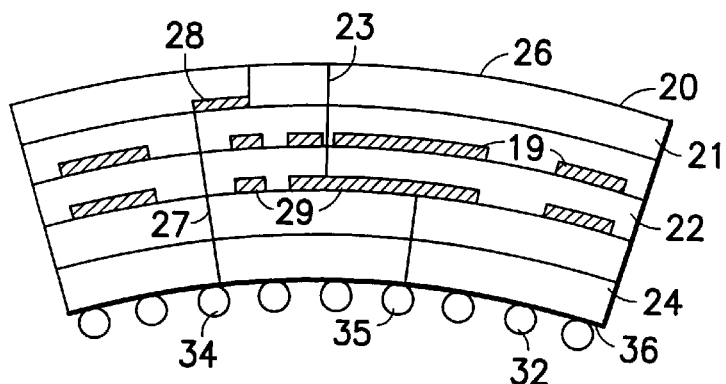
FIG. 2, is a profile taken from a five layer ceramic substrate which has a positive via bulge and camber.

FIG. 2 is a profile taken from a five layer ceramic substrate 20, which has a positive via bulge and camber.

Figure 3:
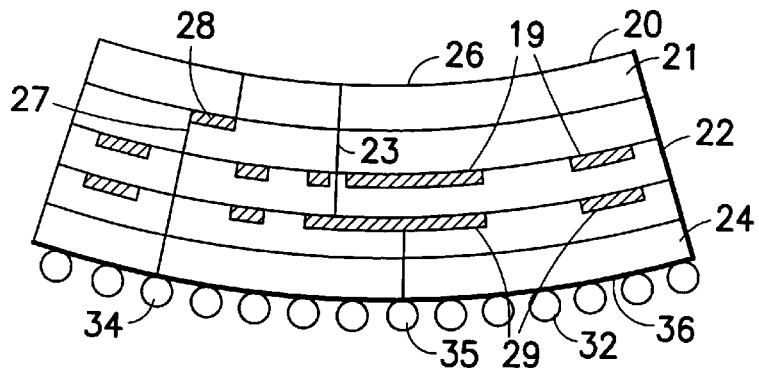
FIG. 3, is a profile taken from a five layer ceramic substrate which has a negative via bulge and camber.

FIG. 3 is a profile taken from a five layer ceramic substrate 20, which has a negative via bulge and camber. The sign is chosen arbitrarily to denote switching in the substrate curvature from one side to the other.

To increase the chance of reducing the ceramic shrinkage gradients within the substrate 20, the layer thickness of the first layer should preferably match the layer thickness of the last layer. It has also been found that for thin ceramic products, for example with less than eight layers, no additional matching is needed to maximize the uniformity of ceramic shrinkage distribution within the substrate 20, once the two external layers are matched. This rule does not preclude the use of external layers with different thicknesses if additional effort is spent in matching the shrinkage rate of the ceramic layer pair. However, camber will be present in a ceramic substrate 20 even when the ceramic shrinkage gradient is zero, but in this case all the camber can be attributed to the imbalance in the distribution of metallurgy within the ceramic substrate 20. This metal distribution imbalance can be corrected by the use of different metal volume and paste type in each voltage plane as discussed below.

Thus, some flexibility is needed when designing a voltage plane in order to produce a ceramic substrate 20 with acceptable camber. Such flexibility can be achieved in part by altering the amount of metal designed in the voltage planes. Location and layout details of each internal metal layer in the substrate 20 is typically driven by the electrical requirements of the substrate 20. However, the designer of the substrate 20 has some level of flexibility on the design of voltage and ground planes when deciding the area coverage for a given voltage plane. For example, a given voltage plane can be built with two different levels of metal loading, but still can satisfy the same electrical requirement, as long as adequate localized metal loading is provided over specific critical areas which surround critical timing circuits.

For a given voltage plane designed with the minimum required area coverage, for example about 20 percent, the designer can easily increase the metal covered area by about 10 percent to about 30 percent if needed. Only lower increases are possible when the area covered initially is high. In that case, an alternative method to increase the amount of metal in a given voltage plane, without significant change in the area covered by the metal, is to deposit a metal layer of higher thickness over the ceramic layer during the layer fabrication step prior to sintering. This method is easily applicable to the existing processes used to deposit thick metal films over ceramic layers but requires the expense of retooling some of the line components; thus it should be used sparingly.

An alternative method would be to modify the response of a ceramic substrate 20 during sintering by using a different metal paste composition in each voltage layer. Since the level of camber generated by a given paste composition on a given substrate 20 design depends directly on the differential rate of shrinkage between the metal and ceramic phases, the use of refractory materials as additives in the metal phase tend to alter the metal phase densification rate.

To measure the difference between two metal paste types, it is necessary to build a ceramic camber test vehicle preferable with a ceramic layer count and size equal to the product being designed. One layer near the top surface of the test vehicle is then screened with a voltage layer having similar design as the top voltage layer of the substrate 20 of interest. The selected layer of the test vehicle is then built with several metal pastes of different compositions, then the different test vehicles are sintered and measured. Taking as reference the sample built with the paste most commonly used to screen voltage planes, a Relative Camber Number (RCN) is assigned to each paste by dividing the camber of the substrate built with such paste by the camber measured from the ceramic sample which is used as reference.

Figure 4:
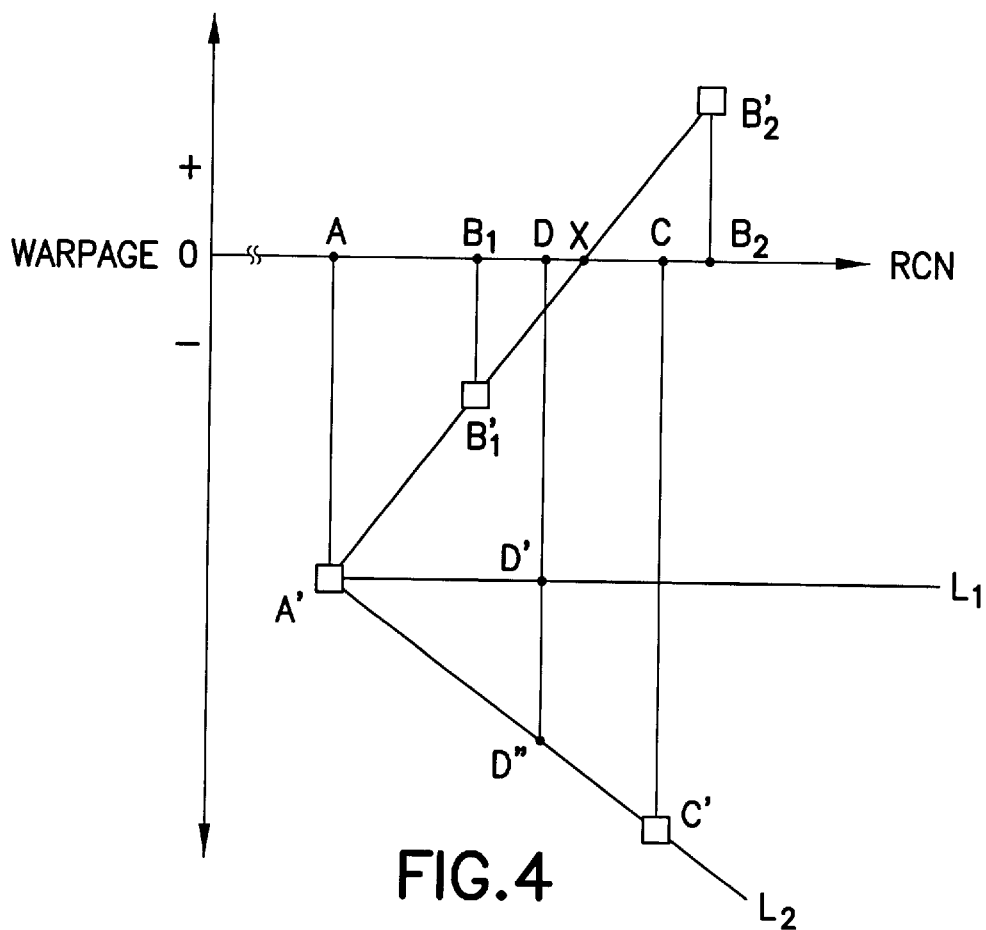
FIG. 4, is a graphical representation of one way to optimize via bulge and camber of a ceramic package.

The above-mentioned rules and criteria, which are part of the invention of this disclosure, can now be used to improve the camber response of a ceramic substrate 20 that has already been electrically designed. First, a ceramic sample A is built with both voltage planes using the metal paste with the lowest RCN value available to the manufacturing line. Then, a second ceramic sample B is built using the paste with the highest RCN value on the top voltage layer and the lowest RCN value on the lowest voltage layer. A third ceramic sample C, built using the highest RCN value on the bottom voltage plane and the lowest RCN number on the top voltage plane, may be required in some cases. In all samples, the metal paste used in all other non-voltage plane locations is kept unchanged and equal to the desired metal paste and distribution in the final ceramic product. Taking into account the direction of the substrate warping by assigning a sign to the camber measurement, a plot of warping vs RCN value of the top layer is built as shown in FIG. 4. FIG. 4 is a graphical representation of one way to optimize via bulge and camber of a ceramic substrate 20, where X represents the RCN value needed on the top voltage layer to have zero warpage. This plot can also be used to define the RCN value needed at the top voltage layer to make the given ceramic design flat and camber and bulge free.

However, several possible situations can develop after measuring samples A and B described above. The simplest case results when sample A or B result in acceptable camber and no further action is needed. However the most likely outcome is that sample A will result with some large negative warpage, as shown in FIG. 4 by the point A', if the substrate 20 is built with Alumina ceramic and Molybdenum metal phases. Here, the ceramic warpage is considered negative when the sample bends toward the bottom surface. In this particular case, the camber of sample B or $B_1$ could have the same curvature but lower magnitude than sample A, as shown in FIG. 4 by the point $B_1'$, but the camber value will still be sufficiently high to require rework. In this case, the substrate 20 can be made flat by using the metal paste selection of sample B and increasing the paste volume of the top voltage plane by a fraction equal to the ratio between the segments $B_1$–X and O–B, from the RCN axis on FIG. 4.

A more complex situation could develop when the warpage of the sample B or $B_2$ is still larger than the acceptable camber level but has opposite sign than the warpage of sample A, as represented in FIG. 4 by the point $B_2'$. Three possible actions can be used here to solve the camber problem in this case. The simplest solution here results when a metal paste with an RCN number equal to X is available and can be used on the top voltage plane. Also, if the top voltage plane has been initially designed with excess metal coverage and it is possible to subtract metal from it, the substrate 20 camber in this situation can be made zero by subtracting a fraction from the metal area equal to the ratio between the segments X–$B_2$ and O–$B_2$, and substrate 20 is built using the metal paste selection of sample B. However, if metal can only be added to the substrate 20, then the metal volume of the bottom voltage plane needs to be increased. In this case, the ceramic substrate 20 can be made flat after sintering by building the substrate 20 using the same paste selection as sample B and increasing the metal volume in the lower voltage plane by a fraction equal to the ratio between the segments A–D and O–A from the RCN axis on FIG. 4. Point D on the RCN axis is found by extending the segment $B_2$–$B_2'$, after it has been moved and fitted inside the region defined by the lines $L_1$ and $L_2$, while preserving the segment orientation and length, while D' is on the $L_1$ line, and D" is on the $L_2$ line.

The method described above works best when the ceramic substrate 20 under design has low initial metal imbalance and the camber generated by such design is lower than say 300 microns. In building such ceramic substrate 20, experience has shown that such camber limit is easier to satisfy when the vertical distance between the top voltage plane and the top surface of the substrate 20 is similar to the distance between the bottom voltage plane and the bottom surface of the substrate 20. If this condition can not be met, then the effort to balance the substrate 20 will require the use of metal pastes with a large span of RCN value and the use of large differences in the metal volume between these two voltage planes.

Figure 5:
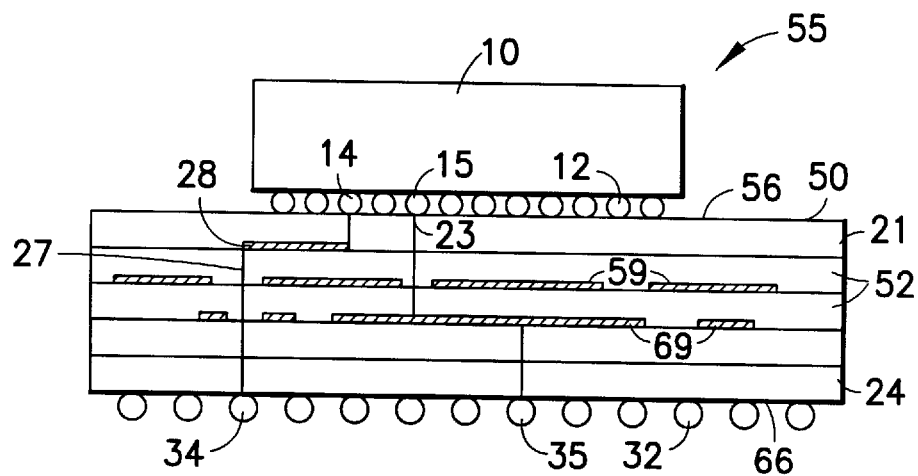
FIG. 5, illustrates a preferred embodiment of the invention where metal in one of the voltage planes has been modified to provide for a flat ceramic substrate.

FIG. 5 illustrates a preferred embodiment 55 of the invention where the design of metal 59 and/or 69 has been modified to provide for a flat ceramic substrate 50. Ceramic layers 52 are built with a voltage or signal plane, 59 and/or 69, using the results from FIG. 4. After sintering it was found that the top surface 56 and the bottom surface 66 had an acceptable camber and/or bulge, and this camber and/or bulge was within the design parameters. The substrate 50 was now ready for joining to the chip 10 to form the module 55.

The method described above to create flat thin and small ceramic substrate 20 was described using the design details of a five layer ceramic substrate 20 built from Alumina ceramic and Molybdenum metal phases. However, the same procedure can be easily extended to the design of a ceramic substrate with different layer count and materials phases by those skilled in the art.

The multilayer ceramic substrate could comprise at least four ceramic layers with at least two internal voltage/ground planes, wherein at least a portion of at least one internal voltage/ground plane is screened with two different electrically conductive metal pastes. The multilayer ceramic substrate could be such that the difference in metal volume coverage between the two different electrically conductive metal pastes could be greater than at least about 10 percent. However, for some cases the multilayer ceramic substrate could be such that the difference in metal volume coverage between said two different electrically conductive metal pastes is less than about 10 percent. An important point to note here is that the two different metal paste coverage could be on the same internal voltage/ground plane or it could be between two different internal voltage/ground planes.

Using the method of this invention one can evaluate and define an accurate design modification for a given thin and small MLC substrate to eliminate the need for substrate flattening to control camber and via bulge. This could be done by evaluating the initial design with two different metal pastes on the voltage planes as described previously, and then adjusting the metal volume coverage of one or more of the voltage planes or other metal plane according the method. Of course, a similar procedure would be used when the same metal material is used in the different voltage planes.

The method of this invention reduces the efforts needed to produce a flat thin and small substrate which requires no flattening. This can be done by selecting one or more of the following substrate design recommendations, such as, (a) matching the thickness of the top and the bottom layers, and/or (b) eliminating any processing differences between the top and bottom ceramic layers when selecting the ceramic layers before sintering.

EXAMPLES

The following examples are intended to further illustrate the invention and are not intended to limit the scope of the invention in any manner.

Example 1

This is a particular example of a camber and/or bulge as shown in FIG. 2, where the surface profile of a typical substrate after sintering was measured using a surface profilometer. It was found that the via bulge was about 40 microns on the vertical axis, and the total camber was over 80 microns. This via bulge was found to be unacceptable, and rework to produce a flat planar ceramic substrate was now needed on this ceramic substrate. After rework, the surface profile of the reworked substrate was measured which showed an acceptable via bulge of only about 15 microns on the same horizontal axis range used to determine the via bulge before rework.

Example 2

A flat thin electronic ceramic substrate 20 was prepared, where the ceramic substrate 20 design had at least two internal voltage planes, as shown in FIG. 5. The voltage plane near the top surface of the substrate 20 was screened with a metal paste which had produced the largest camber in one of the metal layer test vehicles. The second voltage plane that is farthest from the previous voltage plane was screened with a metal paste which had produced the lowest camber in a one layer test vehicle. In addition, the metal paste volume on the top voltage plane was then modified by the addition of at least 5 percent metal paste volume to produce a multi-layer ceramic substrate that had via bulge below about 15 microns and total camber less than about 50 microns.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as failing within the true scope and spirit of the present invention.

What is claimed is:

1. A multilayer ceramic substrate comprising at least four ceramic layers with at least two internal voltage planes, wherein said at least two internal voltage planes are screened with the same electrically conductive metal paste and have a difference in metal volume coverage of at least about 10 percent, and wherein said substrate has a camber of less than about 50 microns.

2. The substrate of claim 1, wherein said difference in metal volume is generated by modifying the metal area coverage of at least one metal layer.

3. The substrate of claim 1, wherein said difference in metal volume is generated by modifying the metal thickness of at least one metal layer.

4. The substrate of claim 1, wherein said difference in metal volume is generated by modifying both the metal area coverage and the metal thickness of at least one metal layer.

5. The substrate of claim 1, wherein at least one semiconductor element is secured to said substrate by at least one means selected from the group consisting of solder ball, solder mass, solder column, C4, and wire bond.

6. The substrate of claim 5, wherein said semiconductor element is selected from the group consisting of chip and capacitor.

7. The substrate of claim 5, wherein said substrate has at least one means of connecting to at least one second level packaging, wherein said connecting means is selected from the group consisting of solder ball, solder mass, solder column, compression pad, tab, and wire bond.

8. The substrate of claim 1, wherein said metal volume difference is added to at least one non-voltage plane as a non-functional metal volume coverage.

9. A multilayer ceramic substrate comprising at least four ceramic layers with at least two internal voltage planes, wherein said at least two internal voltage planes are screened with at least two different electrically conductive metal pastes and have a difference in metal volume coverage of at least about 10 percent, and wherein said substrate has a camber of less than about 50 microns.

10. The substrate of claim 9, wherein said difference in metal volume is generated by modifying the metal area coverage of at least one metal layer.

11. The substrate of claim 9, wherein said difference in metal volume is generated by modifying the metal thickness of at least one metal layer.

12. The substrate of claim 9, wherein said difference in metal volume is generated by modifying both the metal area coverage and the metal thickness of at least one metal layer.

13. The substrate of claim 9, wherein at least one semiconductor element is secured to said substrate by at least one means selected from the group consisting of solder ball, solder mass, solder column, C4, and wire bond.

14. The substrate of claim 13, wherein said semiconductor element is selected from the group consisting of chip and capacitor.

15. The substrate of claim 13, wherein said substrate has at least one means of connecting to at least one second level packaging, wherein said connecting means is selected from the group consisting of solder ball, solder mass, solder column, compression pad, tab, and wire bond.

16. The substrate of claim 9, wherein said metal volume difference is added to at least one non-voltage plane as a non-functional metal volume coverage.

17. A multilayer ceramic substrate comprising at least four ceramic layers with at least two internal voltage planes, wherein at least a portion of at least one internal voltage plane is screened with at least two different electrically conductive metal pastes, and wherein said substrate has a camber of less than about 50 microns.

18. The substrate of claim 17, wherein said at least two internal voltage planes have a difference in metal volume coverage of at least about 10 percent.

19. The substrate of claim 17, wherein said at least two internal voltage planes have a difference in metal volume coverage of less than about 10 percent.

20. The substrate of claim 1, wherein said camber is less than about 30 microns.

21. The substrate of claim 9, wherein said camber is less than about 30 microns.

22. The substrate of claim 17, wherein said camber is less than about 30 microns.

* * * * *